(12) United States Patent
Moon

(10) Patent No.: US 9,331,300 B2
(45) Date of Patent: *May 3, 2016

(54) THIN FILM TRANSISTOR AND ORGANIC LIGHT EMITTING DIODE DISPLAY INCLUDING THE SAME

(71) Applicant: Samsung Display Co., Ltd., Yongin-si, Gyeonggi-do (KR)

(72) Inventor: Sung-Hoon Moon, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 35 days.

This patent is subject to a terminal disclaimer.

(21) Appl. No.: 13/900,772

(22) Filed: May 23, 2013

(65) Prior Publication Data

US 2014/0042405 A1 Feb. 13, 2014

(30) Foreign Application Priority Data

Aug. 9, 2012 (KR) .......................... 10-2012-0087497

(51) Int. Cl.
*H01L 27/15* (2006.01)
*H01L 51/52* (2006.01)
*H01L 29/786* (2006.01)
*H01L 27/32* (2006.01)

(52) U.S. Cl.
CPC ............ *H01L 51/52* (2013.01); *H01L 27/3248* (2013.01); *H01L 29/786* (2013.01); *H01L 29/78618* (2013.01); *H01L 29/78696* (2013.01); *H01L 27/3262* (2013.01)

(58) Field of Classification Search
CPC .................. H01L 29/78618; H01L 29/78696; H01L 27/3262; H01L 27/3248
See application file for complete search history.

(56) References Cited

U.S. PATENT DOCUMENTS

| 8,633,523 | B2 * | 1/2014 | Park | H01L 29/41733 257/288 |
|---|---|---|---|---|
| 2005/0285108 | A1 * | 12/2005 | Choi | 257/59 |
| 2007/0008443 | A1 * | 1/2007 | Seo et al. | 349/43 |
| 2009/0027581 | A1 * | 1/2009 | You et al. | 349/48 |
| 2009/0033231 | A1 * | 2/2009 | Koo | H01L 27/12 315/169.3 |
| 2010/0066934 | A1 * | 3/2010 | Kim et al. | 349/39 |

FOREIGN PATENT DOCUMENTS

KR 10-2008-0061823 7/2008
KR 10-2012-0044503 5/2012

* cited by examiner

*Primary Examiner* — Su C Kim
(74) *Attorney, Agent, or Firm* — Knobbe Martens Olson & Bear LLP

(57) ABSTRACT

A thin film transistor includes a semiconductor formed on a substrate and having a source region, a first drain region spaced apart from the source region by a first current channel, and a second drain region spaced apart from the source region by a second current channel which has the different length from that of the first current channel, a gate electrode insulated from the semiconductor by a gate insulating layer, a source electrode connected to the source region of the semiconductor, a first drain electrode connected to the first drain region of the semiconductor, a second drain electrode connected to the second drain region of the semiconductor, and a bypass line electrically connecting the first drain region and the second drain region.

13 Claims, 4 Drawing Sheets

THIN FILM TRANSISTOR AND ORGANIC LIGHT EMITTING DIODE DISPLAY INCLUDING THE SAME

CROSS-REFERENCE TO RELATED APPLICATIONS

This application claims priority to and the benefit of Korean Patent Application No. 10-2012-0087497 filed in the Korean Intellectual Property Office on Aug. 9, 2012, the entire contents of which are incorporated herein by reference.

BACKGROUND

1. Field

The described technology relates generally to a thin film transistor and an organic light emitting diode (OLED) display including the same.

2. Description of the Related Technology

Among flat panel displays, an organic light emitting diode (OLED) display, which displays an image by using an organic light emitting diode (OLED) that generates light by recombining electrons and holes, has an advantage to provide fast response speed while being driven with relatively lower power consumption.

An organic light emitting diode (OLED) display has a plurality of pixels which is arranged in a matrix format at the intersections of a plurality of data lines, scan lines, and driving power lines. In general, each of the pixels includes an organic light emitting diode (OLED) and a driving transistor for controlling current flowing into the organic light emitting diode (OLED). Such pixels supply current from the driving transistor to the organic light emitting diode (OLED) in response to data signals and generate light at predetermined luminance.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One embodiment provides a thin film transistor including: a semiconductor formed on a substrate and having a source region, a first drain region separated from the source region by a first current channel, and a second drain region separated from the source region by a second current channel which has a different length from that of the first current channel; a gate electrode insulated from the semiconductor by a gate insulating layer; and a bypass line electrically connecting the first drain region and the second drain region.

The first current channel may be longer than the second current channel.

The gate electrode may overlap the source region of the semiconductor and channel regions.

The thin film transistor may further include an interlayer insulating layer formed on the gate insulating layer, in which the bypass line may be connected to the first drain region and the second drain region through a contact hole formed on the interlayer insulating layer.

Another embodiment provides an organic light emitting diode (OLED) display including: a scan line formed on a substrate and delivering a scan signal; a data line and a driving power line crossing the scan line and delivering a data signal and driving voltage, respectively; a switching transistor connected to the scan line and the data line; a driving transistor including a semiconductor having a source region connected to the drain electrode of the switching transistor, a first drain region separated from the source region by a first current channel, and a second drain region spaced from the source region by a second current channel which has the different length from that of the first current channel; a bypass line electrically connecting the first drain region and the second drain region; and an organic light emitting diode (OLED) connected to the first drain region.

The organic light emitting diode (OLED) display may further include a compensation transistor compensating for the threshold voltage of the driving transistor and connected to the second drain region of the driving transistor.

The gate electrode of the driving transistor may be connected to the drain electrode of the compensation transistor, and the second drain region of the driving transistor may be connected to the source electrode of the compensation transistor.

The organic light emitting diode (OLED) display may further include a storage capacitor connected to the gate electrode of the driving transistor and to the power line.

The bypass line may connect the first drain region and the second drain region using a contact hole.

The first current channel may be longer than the second current channel.

The semiconductor may have an inverted T-shape.

The gate electrode of the driving transistor may overlap the first and second channel regions.

The organic light emitting diode (OLED) display may further include an initialization transistor providing initialization voltage to the gate electrode of the driving transistor, an operation control transistor providing driving voltage to the source electrode of the driving transistor, and a light emission control transistor connecting the second drain region of the driving transistor to the organic light emitting diode (OLED).

The organic light emitting diode (OLED) display may further include a boost capacitor connected between the gate electrode of the driving transistor and the scan line to which the scan signal is supplied.

DETAILED DESCRIPTION OF CERTAIN INVENTIVE EMBODIMENTS

When a black grayscale is implemented and then a white grayscale is represented, the pixels may have a problem in that light at lower luminance than desired is generated for a predetermined period, so that each of the pixels fails to represent the image with desired luminance corresponding to the grayscale. This results in a problem in that the characteristic of the driving transistor varies according to the voltage applied to the driving transistor during the previous frame period.

The described technology has been made in an effort to provide a thin film transistor having advantages of easily applying an off bias to initialize the driving transistor to the state before pixels emit light in an organic light emitting diode (OLED) display and an organic light emitting diode (OLED) display including the same.

By using the bypass line, an off bias voltage can be easily applied to the driving transistors included in each of the pixels before emitting light. When off bias voltage is applied to the driving transistor, the characteristic of the driving transistor is initialized to a predetermined state, and therefore an image having uniform luminance can be displayed.

The present invention will be described more fully hereinafter with reference to the accompanying drawings, in which certain embodiments of the invention are shown. As those skilled in the art would realize, the described embodiments may be modified in various ways, all without departing from the spirit or scope of the present invention.

Figure 1:
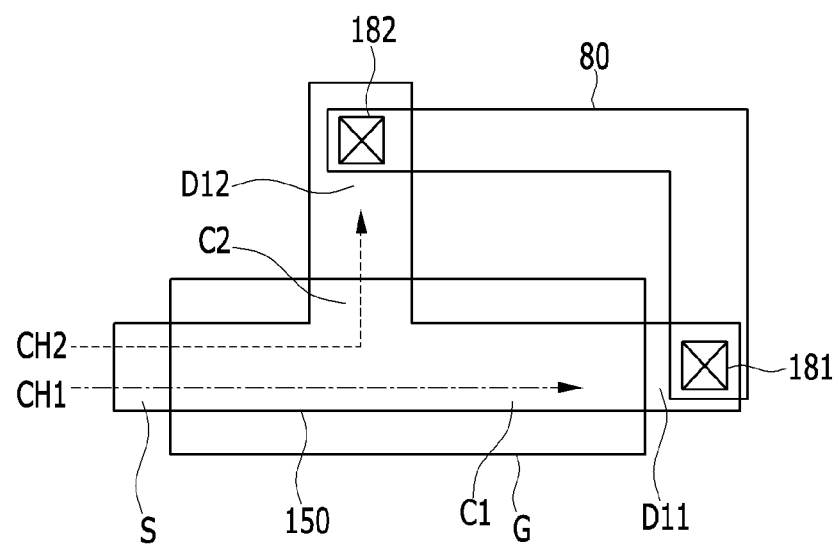
FIG. 1 is a plan view describing a thin film transistor according to an embodiment.
Figure 2:
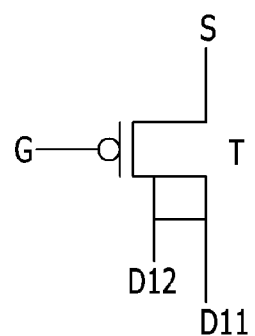
FIG. 2 is an equivalent circuit diagram according to an embodiment.

FIG. 1 is a plan view describing a thin film transistor according to an embodiment and FIG. 2 is an equivalent circuit diagram according to the embodiment.

As illustrated in FIGS. 1 and 2, a thin film transistor T according to an embodiment includes a semiconductor 150 disposed on a substrate (not shown) and having a source region S, a first drain region D11, a second drain region D12, and channel regions C1 and C2, a gate electrode G that overlaps the channel regions C1 and C2 of the semiconductor 150 as being insulated by a gate insulating layer (not shown), and a bypass line 80 that electrically connects the first drain region D11 and the second drain region D12 through contact holes 181 and 182.

Since there is an insulating layer, such as an interlayer insulating layer or a gate insulating layer between the semiconductor 150 and the bypass line 80, the first and second drains D11 and D12 are connected through the contact holes 181 and 182.

The semiconductor 150 includes one source region S and two drain regions D1 and D2, forming two different current channels CH1 and CH2. As illustrated in FIG. 1, the semiconductor 150 may have an inverted T-shape. In other embodiments, the semiconductor 150 may have a variety of other shapes.

The semiconductor 150 may be formed of amorphous silicon, polysilicon or oxide semiconductor, the gate electrode G may be formed of polysilicon or metal, and the source electrode connected to the source region S, the first drain electrode connected to the first drain region D11, and the second drain electrode connected to the second drain region D12 may be formed of metal or an alloy.

The gate electrode G overlaps the source region of the semiconductor and the channel regions C1 and C2 providing the first current channel CH1 and the second current channel CH2.

By forming the first current channel CH1 and the second current channel CH2, which are different from each other, it is possible to simultaneously provide different magnitudes (amounts) of current through the first and second current channels CH1 and CH2. For example, if the first current channel CH1 is shorter than the second current channel CH2, the first current channel CH1 may provide a relatively larger current than the second current channel CH2, and the second current channel CH2 may provide a relatively smaller current than the first current channel CH2.

By enabling one thin film transistor T to simultaneously provide different currents, it is possible to relatively simply design a circuit for realizing two different objectives. Also, since it is possible to reduce the number of components less than conventionally required, such configuration is advantageous for high-integration.

The bypass line 80 is configured to deliver electric signals to circuit elements electrically connected to the first drain region D11 or the second drain region D12. For example, the bypass line 80 may be used for applying an off bias from a wire connected to the second drain region D12 to a circuit element connected to the first drain region D11.

If the bypass line 80 is not formed, an off bias signal applied to the first drain region D11 or the second drain region D12 may be subjected to a voltage drop due to the highly resistive region in the channel regions C1 and C2. However, if the bypass line 80 is formed, the voltage drop does not occur since an off bias signal can be delivered to a circuit connected to the first drain region D11 or a circuit connected to the second drain region D12 through the bypass line 80, not through the channel regions C1 and C2.

Hereinafter, the organic light emitting diode (OLED) display having the thin film transistor in FIG. 1 will be described in detail.

Figure 3:
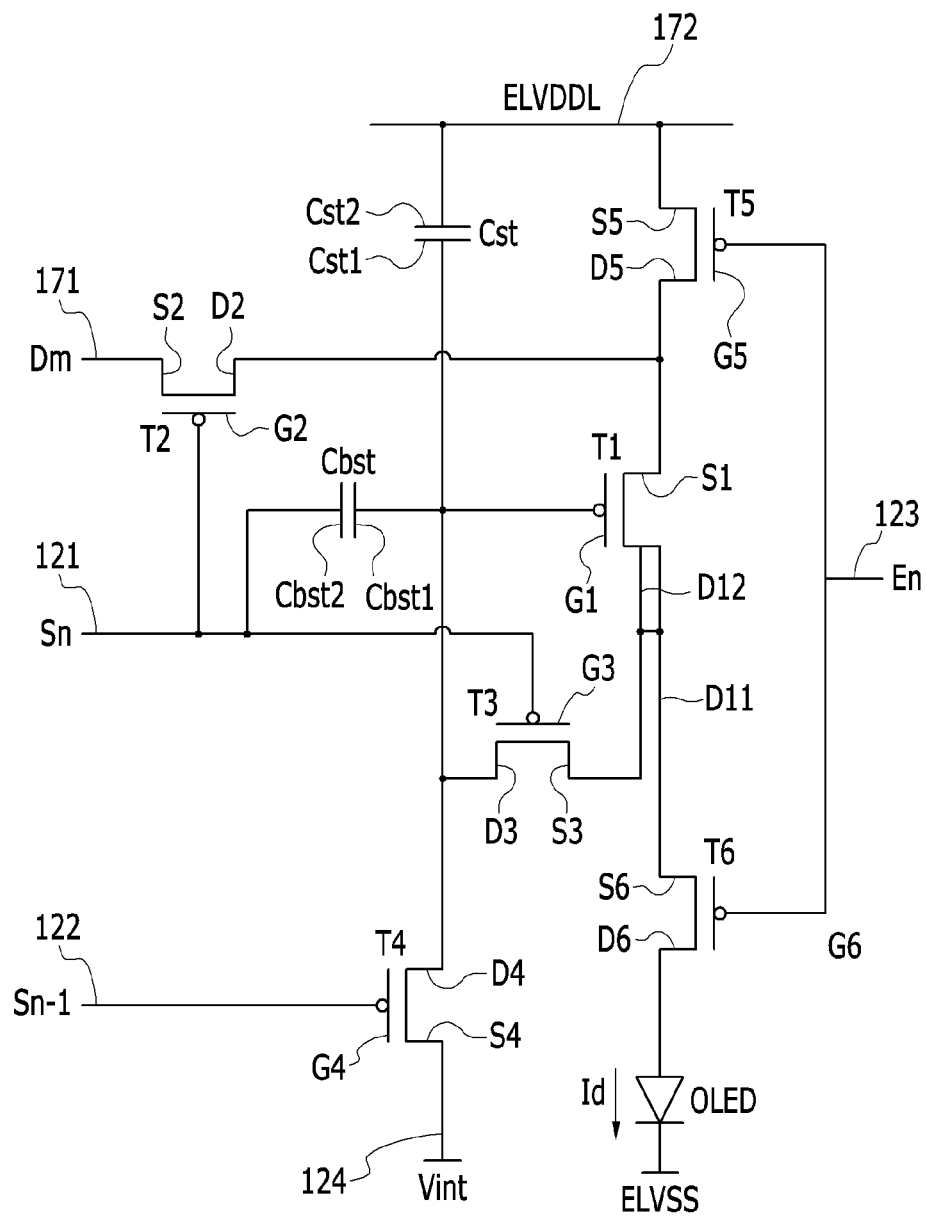
FIG. 3 is an equivalent circuit diagram of one pixel in an organic light emitting diode (OLED) display according to an embodiment.

FIG. 3 is an equivalent circuit diagram of one pixel in an organic light emitting diode (OLED) display according to an embodiment.

As illustrated in FIG. 3, one pixel of the organic light emitting diode (OLED) display according to the embodiment includes a plurality of signal lines 121, 122, 123, 124, 171, and 172 disposed on a substrate (not shown), a plurality of thin film transistors T1, T2, T3, T4, T5, and T6 connected to the plurality of signal lines, a storage capacitor Cst, a boost capacitor Cbst and organic light emitting diode (OLED).

One pixel circuit includes signal lines that are a scan line 121 delivering a scan signal Sn, a previous scan line 122 delivering a previous scan signal Sn−1 to an initialization transistor T4, a light emission control line 123 delivering a light emission control signal En to a operation control transistor T5 and a light emission control transistor T6, a data line 171 crossing the scan line 121 and delivering a data signal Dm, a driving power line 172 delivering driving voltage ELVDD and substantially parallel to the data line 171, and an initialization power line 124 delivering initialization voltage Vint to initialize the driving transistor T1.

The light emission control signal En has different potential from that of the scan line 121, and may have a wider width than that of the scan signal Sn. For example, when the scan signal Sn is low potential, the light emission control signal En may be applied as high potential.

The gate electrode G1 of the driving transistor T1 is connected to one end Cst1 of the storage capacitor Cst, and the source electrode S1 is connected to the driving power line 172 through the operation control transistor T5. The first drain electrode D11 of the driving transistor T1 is electrically connected to the anode of the organic light emitting diode (OLED) through the light emission control transistor T6, and the second drain electrode D12 of the driving transistor T1 is connected to the source electrode S3 of a compensation transistor T3. The driving transistor T1 receives the data signal Dm upon the switching of the switching transistor T2, and supplies driving current Id to the organic light emitting diode (OLED).

The gate electrode G2 of the switching transistor T2 is connected to the scan line 121, and the source electrode S2 is connected to the data line 171. The drain electrode D2 of the switching transistor T2 is connected to the source electrode S1 of the driving transistor T1, and is also connected to the driving power line 172 through the operation control transistor T5. The switching transistor T2 is turned on in response to the scan signal Sn received through the scan line 121 and performs a switching operation that delivers the data signal Dm delivered to the data line 171 to the source electrode S1 of the driving transistor T1.

The gate electrode G3 of the compensation transistor T3 is connected to the scan line 121, the source electrode S3 is connected to the second drain electrode D12 of the driving transistor T1, the drain electrode D3 of the compensation transistor T3 is connected to one end Cst1 of the storage capacitor Cst, the drain electrode D4 of the initialization transistor T4 and the gate electrode G1 of the driving transistor T1. The compensation transistor T3 is turned on in response to the scan signal Sn received through the scan line 121 to interconnect the gate electrode G1 of the driving transistor T1 and the second drain electrode D12 of the driving transistor T1, so that the driving transistor T1 is diode-connected.

The gate electrode G4 of the initialization transistor T4 is connected to the previous scan line 122, the source electrode S4 is connected to the initialization power line 124, and the drain electrode D4 is connected to the one end Cst1 of the storage capacitor Cst, the drain electrode D3 of the compensation transistor T3 and the gate electrode G1 of the driving transistor T1. The initialization transistor T4 is turned on in response to the previous scan signal Sn−1 received through the previous scan line 122, and delivers the initialization voltage Vint to the gate electrode G1 of the driving transistor T1 to perform an initialization operation to initialize voltage on the gate electrode G1 of the driving transistor T1.

The gate electrode G5 of the operation control transistor T5 is connected to the light emission control line 123, the source electrode S5 of the operation control transistor T5 is connected to the driving power line 172, and the drain electrode D5 of the operation control transistor T5 is connected to the source electrode S1 of the driving transistor T1 and the drain electrode S2 of the switching transistor T2.

The gate electrode G6 of the light emission control transistor T6 is connected to the light emission control line 123, the source electrode S6 of the light emission control transistor T6 is connected to the first drain electrode D11 of the driving transistor T1 and to the source electrode S3 of the compensation transistor T3, and the drain electrode D6 of the light emission control transistor T6 is electrically connected to the anode of the organic light emitting diode (OLED). The operation control transistor T5 and the light emission control transistor T6 are simultaneously turned on in response to a light emission control signal En received through the light emission control line 123, to deliver the driving voltage ELVDD to the organic light emitting diode (OLED) so that the driving current Id flows in the organic light emitting diode (OLED).

One end Cst1 of the storage capacitor Cst is connected to the gate electrode G1 of the driving transistor T1, to the drain electrode D3 of the compensation transistor T3, and to the drain electrode D4 of the initialization transistor T4, and the other end Cst2 of the storage capacitor Cst is connected to the driving power line 172 to form a capacitor.

One end Cbst1 of the boost capacitor Cbst is connected to the scan line 121, and the other end Cbst2 of the boost capacitor Cbst is connected to the drain electrode D3 of the compensation transistor T3 and to the gate electrode G1 of the driving transistor T1. The boost capacitor Cbst causes the potential on the gate electrode G1 of the driving transistor T1 to be increased to a predetermined level by the voltage of the scan signal Sn.

The cathode of the organic light emitting diode (OLED) is connected to common voltage ELVSS. Accordingly, the organic light emitting diode (OLED) receives driving current Id from the driving transistor T1 and emits light to display an image.

To the organic light emitting diode (OLED) display is input the previous scan signal Sn−1 of a low level through the previous scan line 122 during the first period set as an initialization period. Then, the initialization transistor T4 is turned on in response to the previous scan signal Sn−1 of the low level, and an initialization power Vint is supplied from an initialization power line 124 to the driving transistor T1 through an initialization thin film transistor T4, so that the driving transistor T1 is initialized.

Then, during the second period set as a data programming period, a current scan signal Sn of the low level is supplied through the scan line 121. Then, in response to the current scan signal Sn of the low level, the switching transistor T2 and the compensation transistor T3 are turned on.

In addition, the driving transistor T1 is also turned on by being diode-connected by the compensation transistor T3, and particularly, the driving transistor T1 is diode-connected in the forward direction since the driving transistor T1 has been initialized during the previous first period.

By doing so, the data signal Dm supplied from the data line 171 passes the switching transistor T2, the driving transistor T1, and the compensation transistor T3 so that voltage corresponding to the difference between the data signal Dm and the threshold value of the driving transistor T1 is stored in the storage capacitor Cst.

Then, when the supply of the scan signal is stopped and the voltage level of the scan signal is changed to a high level, the voltage applied to the gate electrode G1 of the driving transistor T1 is increased in accordance with the voltage variation of the scan signal by the coupling of the boost capacitor Cbst. In this case, since the voltage applied to the gate electrode G1 of the driving transistor T1 is changed due to the charge sharing between the storage capacitor Cst and the boost capacitor Cbst, the voltage applied to the gate electrode G1 varies in proportion to the value of the charge sharing between the storage capacitor Cst and the boost capacitor Cbst together with the voltage variation of the scan signal.

Then, during the third period set as a light emitting period, the light emission control signal En supplied from the light emission control line 123 is changed from the high level to the low level. Then, the operation control transistor T5 and the light emission control transistor T6 are turned on by the light emission control signal En of the low level during the third period. By doing so, the driving power ELVDDL passes the operation control transistor T5, the driving transistor T1, and the light emission control transistor T6 through the driving power line 172 so that the driving current Id flows in the organic light emitting diode (OLED).

In the pixel circuit configured above, the driving transistor T1 charges voltage corresponding to the data signal Dm on the storage capacitor Cst in response to the scan signal Sn, and provides current corresponding to the voltage charged on the storage capacitor Cst to the organic light emitting diode (OLED). In this case, since the threshold voltage of the driving transistor T1 may vary as time elapses, the compensation transistor T3 diode-connects the driving transistor T1 in response to the scan signal Sn so that the threshold voltage Vth is compensated.

The driving transistor T1 provides the first and second current channels CH1 and CH2 having different lengths, and it is possible to simultaneously provide different currents through the first and second current channels CH1 and CH2. The first current channel CH1 having a short length may provide a relatively larger current, while the second current channel CH2 having a long length may provide a relatively smaller current.

Accordingly, while the data signal Dm is applied, the relatively larger current flowing through the first current channel CH1 quickly charges the storage capacitor Cst to a predetermined voltage (compensation voltage) using the compensation transistor T3, so that the threshold voltage Vth can be compensated quickly and easily.

Further, the relatively smaller current flowing through the second current channel CH2 is provided to the organic light emitting diode (OLED) through the light emission control transistor T6, and thus it is possible to prevent a stain. That is, since the rate of current change relative to a change in voltage applied to the gate electrode G1 of the driving transistor T1 is small, current control voltage range (data swing range) can be increased, and thus the data voltage range representing gamma can be increased, and current deviation between driving thin film transistors having characteristic deviation (distribution) is decreased, thereby preventing a stain due to the difference in the magnitude of current.

The off bias is delivered to the compensation transistor T3 by the common voltage (ELVSS). In this case, by electrically connecting the first drain electrode D11 and the second drain electrode D12 of the driving transistor T1, it is possible to deliver the off bias signal to the compensation transistor T3 without the common voltage ELVSS passing the channel regions of the driving transistor.

Now, the specific configuration of the pixel of the organic light emitting diode (OLED) display illustrated in FIG. 3 will be described in detail with reference to FIG. 4.

Figure 4:
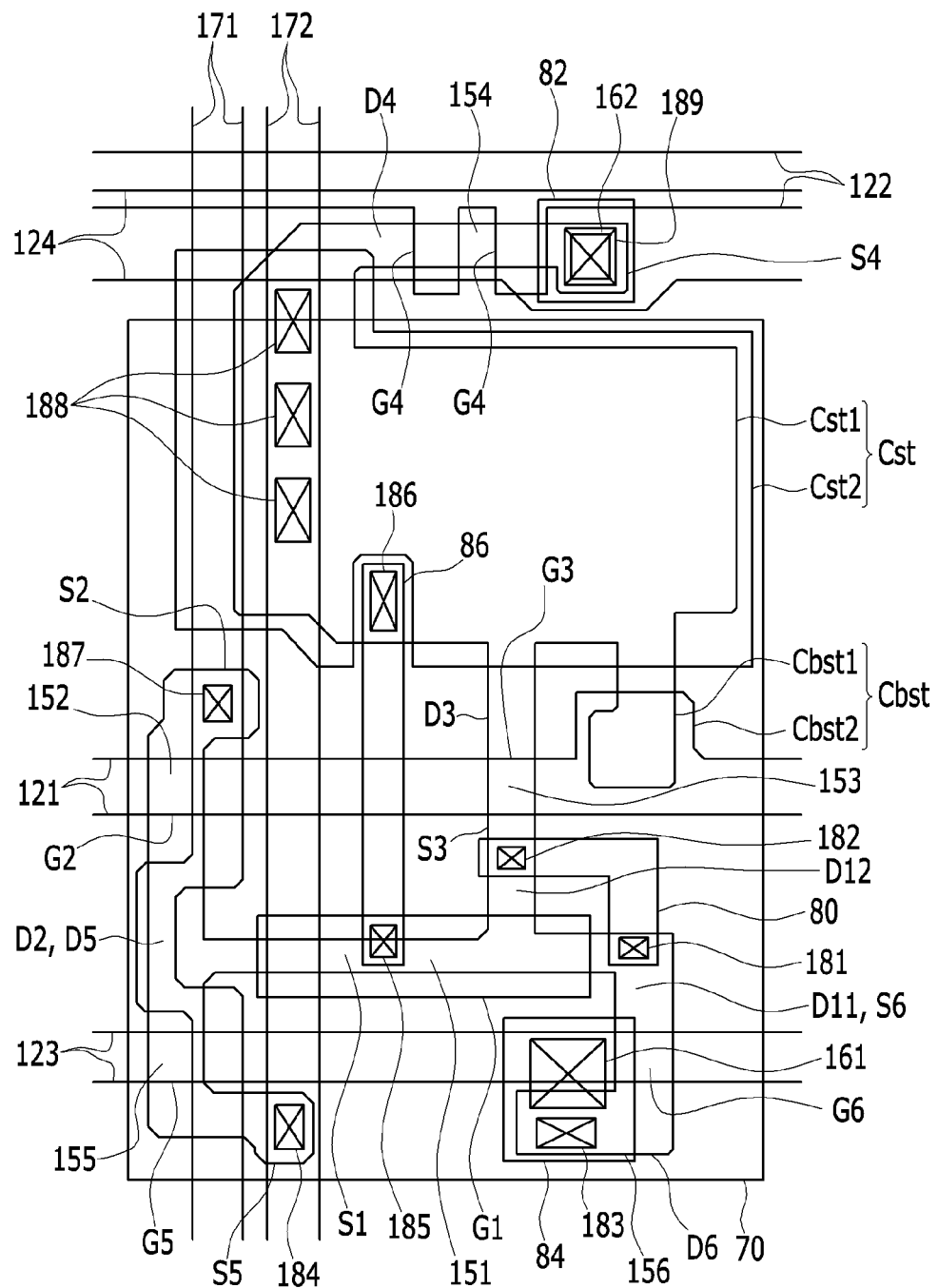
FIG. 4 is a specific layout view of one pixel in an organic light emitting diode (OLED) display according to an embodiment.

FIG. 4 is a detailed layout view of one pixel of the organic light emitting diode (OLED) display according to an embodiment.

FIG. 4 illustrates the interlayer configuration of the transistors; therefore, the source electrodes and drain electrodes correspond to the source region and drain region of the semiconductor, respectively. The source electrode and drain electrode may be a source electrode and a drain electrode formed of a separate metal and then connected to a source region and a drain region or when the source electrode and the drain electrode are not separately formed, the source region and drain region become the source electrode and drain electrode, respectively.

As illustrated in FIG. 4, the pixel of the organic light emitting diode (OLED) display according to an embodiment applies the scan signal Sn, the previous scan signal Sn−1, the light emission control signal En, and the initialization voltage Vint, respectively. The pixel of the OLED display also includes the scan line 121 formed in the row direction, the previous scan line 122, the light emission control line 123, and the initialization power line 124, which crosses all of the scan line 121, the previous scan line 122, the light emission control line 123 and the initialization power line 124. The pixel also includes the data line 171 and the driving power line 172 that apply the data signal Dm and the driving voltage ELVDD to the pixel, respectively.

The pixel further includes the driving transistor T1, the switching transistor T2, the compensation transistor T3, the initialization transistor T4, the operation control transistor T5, the light emission control transistor T6, the storage capacitor Cst, the boost capacitor Cbst and the organic light emitting diode (OLED) 70.

The driving transistor T1, the switching thin film transistor T2, the compensation thin film transistor T3, the initialization thin film transistor T4, the operation control thin film transistor T5 and the light emission control thin film transistor T6 are formed along the semiconductor, and the semiconductor has various curved shapes in conformation with each thin film transistor.

The semiconductor is formed of polysilicon, and includes a channel region where impurities are not doped, and a source region and a drain region where impurities are doped at the sides of the channel region. Herein, the type of thin film transistor depends on the types of the impurities used, and may include N-type impurity or P-type impurity.

The thin film transistors have semiconductors 151, 152, 153, 154, 155, and 156, and gate electrodes G1, G2, G3, G4, G5, and G6 that overlap the channel regions of the semiconductors 151, 152, 153, 154, 155, and 156 with gate insulating layer interposed, and includes source regions S1, S2, S3, S4, S5, and S6 and drain regions D11, D12, D2, D3, D4, D5, and D6 of the semiconductors 151, 152, 153, 154, 155, and 156.

The scan line 121 has the gate electrode G2 overlapping the semiconductor 152 of the switching transistor T2 and the gate electrode G3 overlapping the semiconductor 153 of the compensation transistor T3, the previous scan line 122 has the gate electrode G4 overlapping the semiconductor 154 of the initialization transistor T4, and the light emission control signal line 123 has the gate electrode G5 overlapping the semiconductor 155 of the operation control transistor T5 and the gate electrode G6 overlapping the semiconductor 156 of the light emission control transistor T6.

The data line 171 is connected to the source region S2 of the switching transistor T2 through a contact hole 187, and the driving power line 172 is connected to the source region S5 of the operation control transistor T5 through a contact hole 184.

The gate electrode G1 of the driving transistor T1 overlaps the semiconductor 151, and the source region S1 is connected to the drain region D2 of the switching transistor T2 and the drain region D5 of the operation control transistor T5.

The gate electrode G1 of the driving transistor T1 is connected to a connection member 86 through a contact hole 185, and the connection member 86 is connected to the lower layer Cst1 of the storage capacitor made of semiconductor through a contact hole 186.

The gate electrode G2 of the switching transistor T2 overlaps the semiconductor 152, the source region S2 is connected to the data line 171 through a contact hole 187, and the drain region D2 is connected to the source region S1 of the driving transistor T1.

The gate electrode G3 of the compensation transistor T3 overlaps the semiconductor 153, the source region S3 is connected to the second drain region D12 of the driving transistor T2, and the drain region D3 of the compensation transistor T3 is connected to the lower layer Cst1 of the storage capacitor Cst.

The gate electrode G4 of the initialization transistor T4 overlaps the semiconductor 154, the source region S4 is connected to a secondary metal pattern 82 through a contact hole 162, and the secondary metal pattern 82 is connected to the initialization power line 124 through a contact hole 189. Then, the drain region D4 is connected to the lower layer Cst1 of the storage capacitor.

The gate electrode G5 of the operation control transistor T5 overlaps the semiconductor 155, the source region S5 is connected to the driving power line 172 through a contact hole 184, and the drain region D5 is connected to the source region S1 of the driving transistor T1.

The gate electrode G6 of the light emission control transistor T6 overlaps the semiconductor 156, the source region S6 is connected to the first drain region D11 of the driving transistor T2, the drain region D6 is connected to a secondary metal pattern 84 through a contact hole 183, and the secondary metal pattern 84 is connected to the organic light emitting diode (OLED) 70 through a contact hole 161.

The storage capacitor Cst forms a capacitor in a manner that the lower layer Cst1 which is connected to the drain region D4 of the initialization transistor T4 and the drain region D3 of the compensation transistor T3, and the upper layer Cst2 which is connected to the driving power line 172 through a contact hole 188 overlap each other, with the insulation layer interposed.

The boost capacitor Cbst forms a capacitor in a manner that the lower layer Cbst1 which is connected to the lower layer Cst1 of the storage capacitor Cst, and the upper layer Cbst2 which protrudes from the scan line 121 overlap each other, with the insulation layer interposed.

Further, the first drain region D11 and the second drain region D12 of the driving transistor are connected to both ends of the bypass line 80 through contact holes 181 and 182.

As described above, certain embodiments have been disclosed in detailed description with reference to the drawings. The terms are used to merely illustrate the embodiments but not to limit the scope of the present invention recited in the claims. Accordingly, those skilled in the art will understand that various modifications and other embodiments are possible. Accordingly, the true technical scope of the present invention to be protected should be defined by the technical idea of the following claims.

DESCRIPTION OF SYMBOLS 151, 151, 153, 154, 155, 156: Semiconductor
S1, S2, S3, S4, S5, S6: Source region, Source electrode
D11, D12, D2, D3, D4, D5, D6: Drain region, Drain electrode
121: Scan line 122: Previous scan line
123: Light emission control line 124: Initialization power line
171: Data line 172: Driving power line
T1, T2, T3, T4, T5, T6: Transistor

What is claimed is:

1. A thin film transistor, comprising:
    a semiconductor formed on a substrate and having a source region, a first drain region spaced apart from the source region by a first current channel, and a second drain region spaced apart from the source region by a second current channel, wherein the second current channel has a different length than the first current channel;
    a gate electrode insulated from the semiconductor by a gate insulating layer; and
    a bypass line electrically connecting the first drain region and the second drain region through contact holes, respectively exposing the first drain region and the second drain region.

2. The thin film transistor of claim 1, wherein:
    the first current channel is longer than the second current channel.

3. The thin film transistor of claim 1, wherein:
    the gate electrode overlaps the source region of the semiconductor and the first and second channel regions.

4. The thin film transistor of claim 1, further comprising:
    an interlayer insulating layer formed on the gate insulating layer, wherein a contact hole is formed on the interlayer insulating layer.

5. An organic light emitting diode (OLED) display, comprising:
    a scan line formed on a substrate and configured to deliver a scan signal;
    a data line crossing the scan line and configured to deliver a data signal;
    a driving power line crossing the scan line and configured to deliver a driving voltage;
    a switching transistor connected to the scan line and the data line;
    a driving transistor including a semiconductor having a source region connected to the drain electrode of the switching transistor, a first drain region spaced apart from the source region by a first current channel, and a second drain region spaced apart from the source region by a second current channel, wherein the second current channel has a different length than the first current channel;
    a bypass line electrically connecting the first drain region and the second drain region through contact holes, respectively exposing the first drain region and the second drain region; and
    an organic light emitting diode (OLED) connected to the first drain region.

6. An organic light emitting diode (OLED) display comprising:
    a scan line formed on a substrate and configured to deliver a scan signal;
    a data line crossing the scan line and configured to deliver a data signal;
    a driving power line crossing the scan line and configured to deliver a driving voltage;
    a switching transistor connected to the scan line and the data line;
    a driving transistor including a semiconductor having a source region connected to the drain electrode of the switching transistor, a first drain region spaced apart from the source region by a first current channel, and a second drain region spaced apart from the source region by a second current channel, wherein the second current channel has a different length than the first current channel;
    a bypass line electrically connecting the first drain region and the second drain region;
    an organic light emitting diode (OLED) connected to the first drain region; and
    a compensation transistor compensating for the threshold voltage of the driving transistor and connected to the second drain region of the driving transistor.

7. The organic light emitting diode (OLED) display of claim 6, wherein:
    the gate electrode of the driving transistor is connected to the drain electrode of the compensation transistor; and
    wherein the second drain region of the driving transistor is connected to the source electrode of the compensation transistor.

8. The organic light emitting diode (OLED) display of claim 5, further comprising:
    a storage capacitor connected to the gate electrode of the driving transistor and to the power line.

9. The organic light emitting diode (OLED) display of claim 5, wherein:
    the first current channel is longer than the second current channel.

10. The organic light emitting diode (OLED) display of claim 5, wherein:
    the semiconductor has an inverted T-shape.

11. The organic light emitting diode (OLED) display of claim 5, wherein:
    the gate electrode of the driving transistor overlaps the first and second channel regions.

12. The organic light emitting diode (OLED) display of claim 5, further comprising:

an initialization transistor providing initialization voltage to the gate electrode of the driving transistor;

an operation control transistor providing driving voltage to the source electrode of the driving transistor; and a light emission control transistor connecting the second drain region of the driving transistor to the organic light emitting diode (OLED).

13. The organic light emitting diode (OLED) display of claim 5, further comprising:

a boost capacitor connected between the gate electrode of the driving transistor and the scan line to which the scan signal is supplied.

* * * * *